United States Patent [19]
Soiferman

[11] Patent Number: 5,218,294
[45] Date of Patent: Jun. 8, 1993

[54] CONTACTLESS TEST METHOD FOR TESTING PRINTED CIRCUIT BOARDS

[75] Inventor: Jacob Soiferman, Winnipeg, Canada

[73] Assignee: Advanced Test Technologies Inc., Weyburn, Canada

[21] Appl. No.: 860,069

[22] Filed: Mar. 30, 1992

Related U.S. Application Data

[63] Continuation of Ser. No. 643,356, Jan. 22, 1991, abandoned.

[51] Int. Cl.$^5$ ............................................. G01R 31/28
[52] U.S. Cl. ............................ 324/158 R; 324/95
[58] Field of Search ............... 324/95, 536, 158 R, 324/537, 538, 201, 244, 83.1, 500; 455/67; 358/101, 106; 340/600; 343/703; 250/341, 334

[56] References Cited

U.S. PATENT DOCUMENTS

| | | | |
|---|---|---|---|
| 3,327,212 | 6/1967 | Taub et al. | 324/95 |
| 3,631,473 | 12/1986 | Honda | 324/95 |
| 4,507,605 | 3/1985 | Geisel | 324/537 |
| 4,704,614 | 11/1987 | Poirier et al. | 324/95 |
| 4,829,238 | 5/1989 | Goulette et al. | 324/95 |

Primary Examiner—Vinh Nguyen
Attorney, Agent, or Firm—Adrian D. Battison; Stanley G. Ade; Murray E. Thrift

[57] ABSTRACT

This application describes a novel method and its implementation for testing unpopulated and populated electronic printed circuit boards (PCBs). This method can be used to develop a new contactless test system (CTS). While eliminating drawbacks of existing test systems, this method measures electromagnetic near field distribution in the vicinity of a PCB, contactlessly, by using suitable sensors (possibly printed near field planar antennas) and sensitive measuring and processing devices. The electromagnetic fields (EMF) are generated by the distribution of charges and currents on paths and elements of the board under test (BUT). Therefore, accurate and repeatable measurements of these fields produce a specific pattern for the BUT. Such a pattern is then compared to a known pattern for the same type of board to determine whether the BUT is faulty or non-faulty.

1 Claim, 5 Drawing Sheets

One Dimensional Sensing Array.

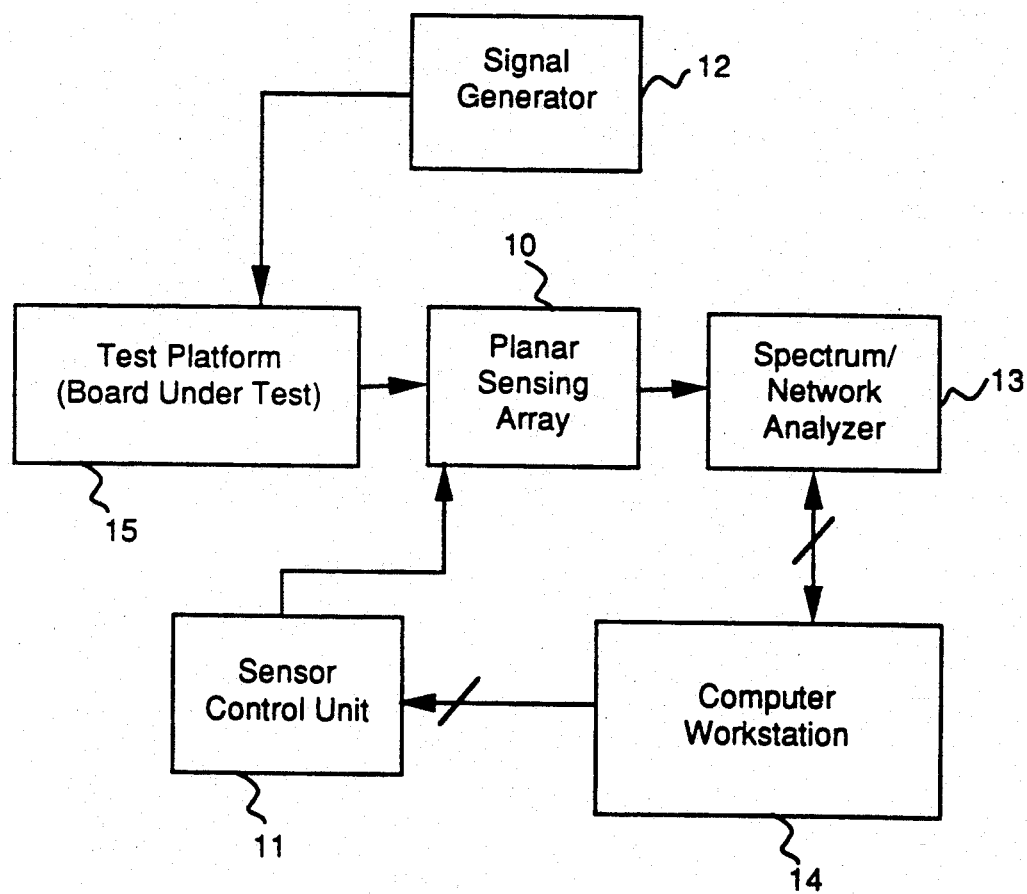
FIG. 1 The Hardware Architecture of the CTS

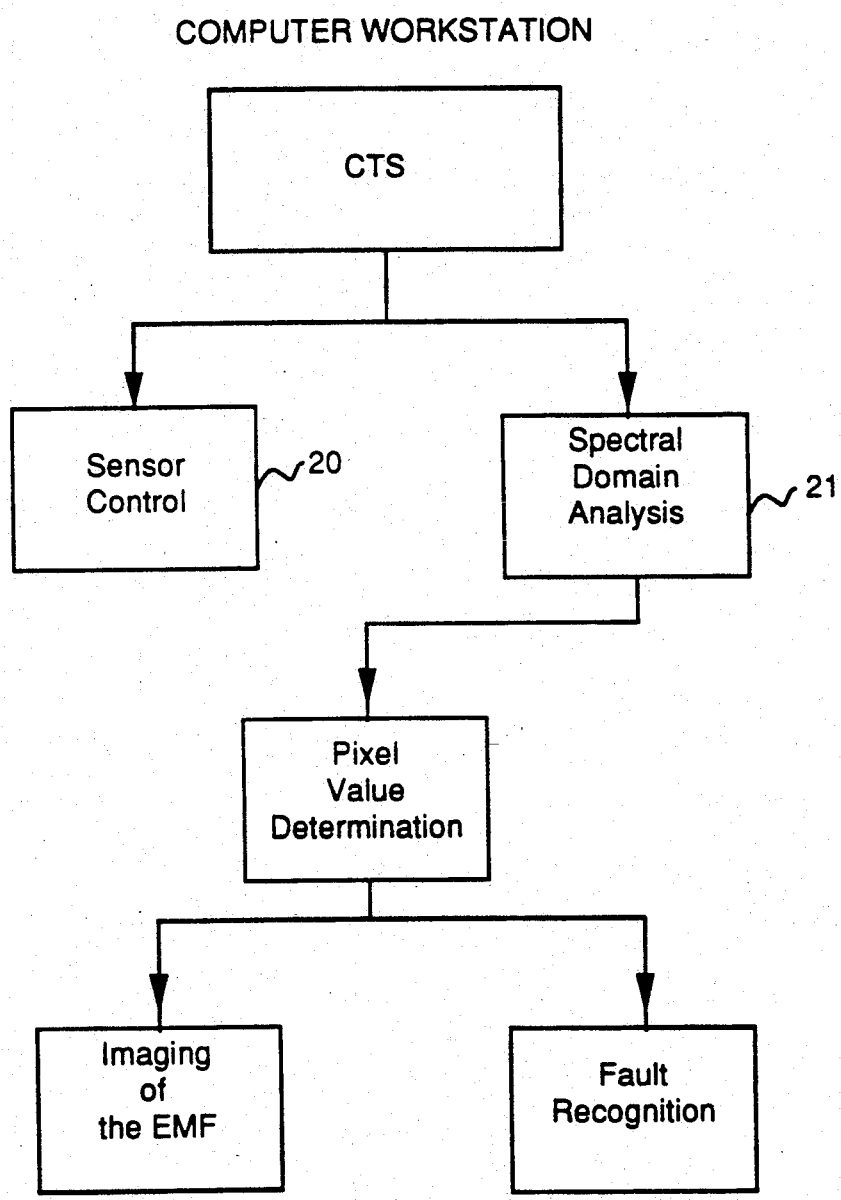
FIG 2. The Software Architecture of the CTS.

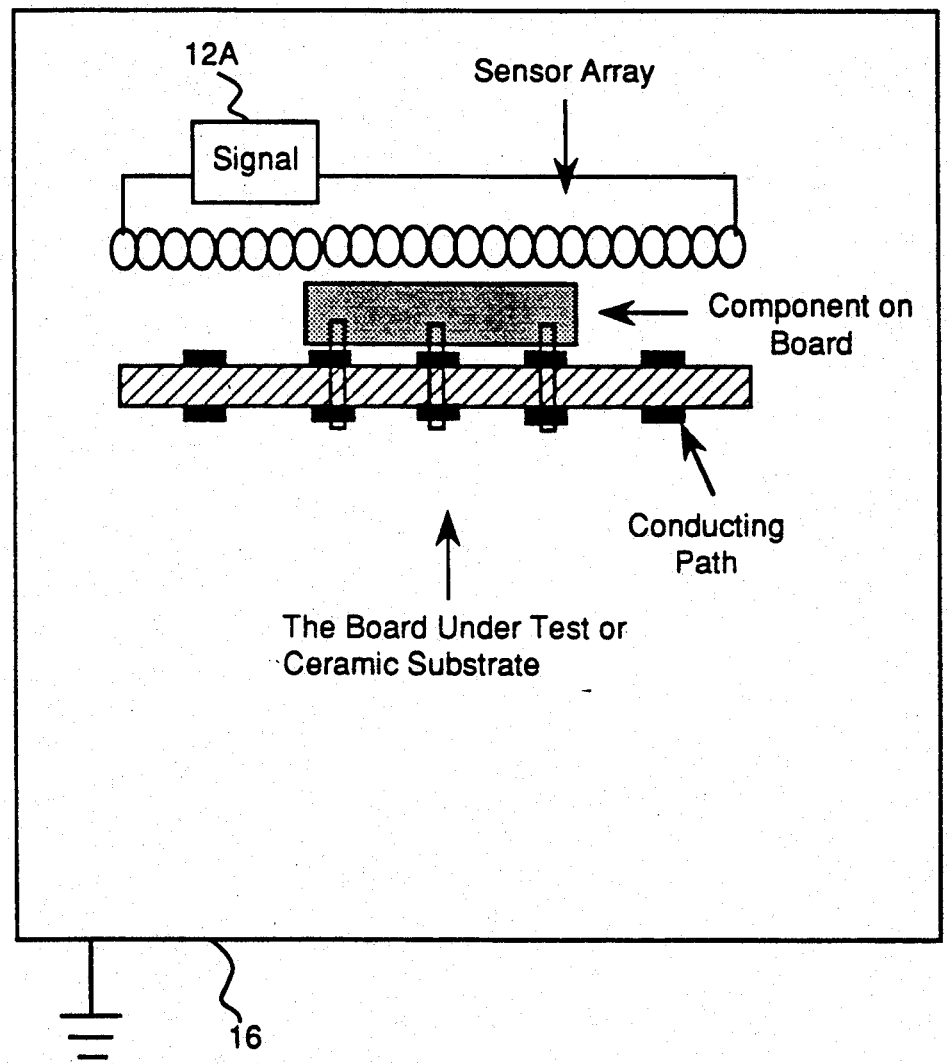
FIG. 3 One Dimensional Sensing Array.

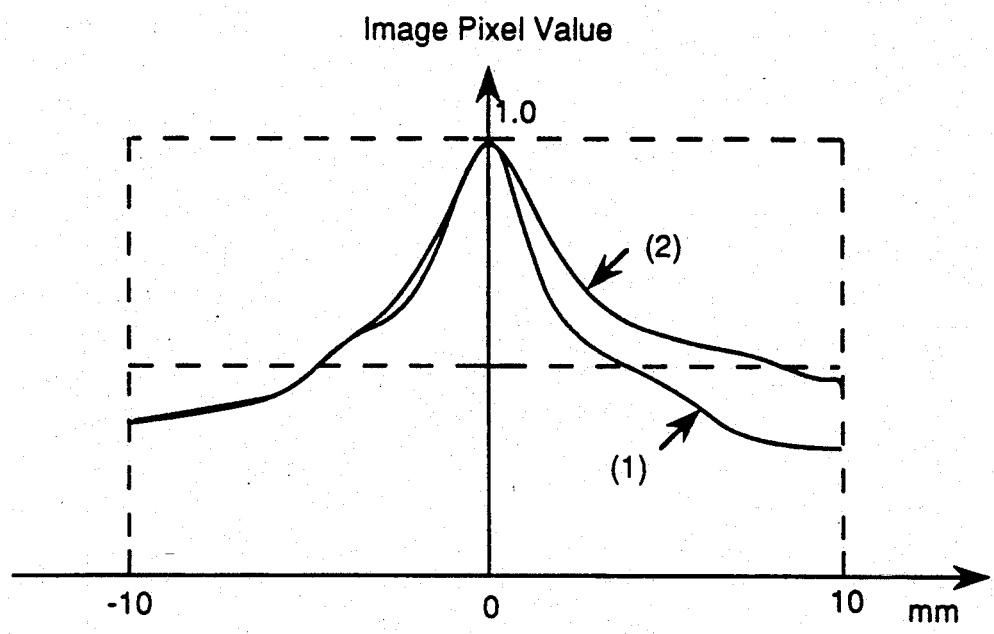
FIG. 4 One Dimensional Images of a Faulty and a Non-faulty boards
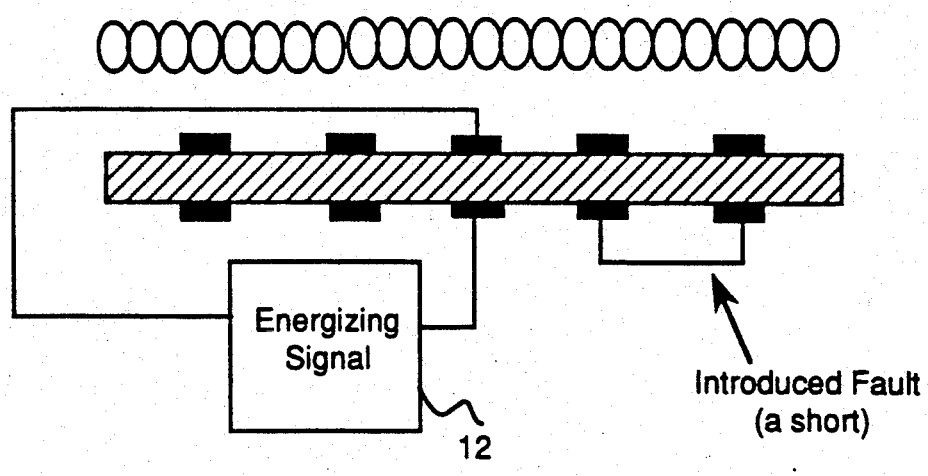
Fig. 6

CONTACTLESS TEST METHOD FOR TESTING PRINTED CIRCUIT BOARDS

This application is a continuation application of application Ser. No. 643,356, filed Jan. 22nd, 1991 now abandoned.

TECHNICAL FIELD

This invention is in the general field of test and measurement of the quality, shape, and/or dimensions of conducting paths, pads, traces, and electronic components formed or placed on the surface or on intermediate layers of a printed circuit board (PCB), ceramic substrate, or like items.

This invention makes available a new and improved method and system for the automatic testing and measurement of unpopulated and/or populated printed circuit boards. This invention enables the detection of electrical defects of components, shorts, discontinuities, and tolerance problems on the board under test (BUT).

BACKGROUND PRIOR ART

During the manufacture or subsequent handling of PCBs, defects such as discontinuities (cracks) or unwanted continuities (shorts) may develop in or between circuit pathways and electronic components. It is necessary to do automated testing of PCBs both for manufacturing and maintenance purposes.

Testing of PCBs is becoming increasingly difficult and more expensive as the use of surface mount technology increases and as integrated circuits and PCBs become more complex and operate at higher frequencies. Conventional techniques for automated PCB testing are based on the idea of applying signals through a set of test pins and measuring output signals at other test pins. This method requires tight mechanical tolerances for the board layout, easily accessible test points, and restricts the frequency band at which a board can be tested (most of the test systems are limited to 100 MHz). The novel method presented here does not have these constraints because of its contactless nature. Another factor separating existing test techniques from this invention, is the contactless test system (CTS) universality. The CTS does not need the custom setup of test pins and test patterns for the BUT, which make presently used test systems expensive and inaccessible to some complex circuit boards. Therefore, the applied CTS offers substantial advantages over existing test methods which utilize electrical contact.

Non-contact probes have been used for measurements on high frequency microwave circuits. However, at frequencies below 1 GHz, the test is difficult due to the high bandwidth of the probes. Most recent advances in the test equipment industry have resulted in devices for the evaluation of electromagnetic compatibility (EMC) of PCB assemblies. However, these devices, in their present forms, provide only information about electromagnetic interference caused by the BUT, and can not be used for providing detailed information about the performance of the BUT. This invention is targeted at measuring detailed EMF for testing the quality and functionality of the BUT.

SUMMARY OF INVENTION

This present invention provides a novel method for testing the quality, shape and/or dimensions of conducting paths, pads, traces, and electronic components formed or placed on the surface or on intermediate layers of a printed circuit board or ceramic substrate. The invention eliminates drawbacks in existing test methods and therefore offers a viable method for the automated contactless performance testing of printed circuit boards (unpopulated and populated). The invented method measures electromagnetic near field distribution in the vicinity of a PCB, contactlessly, for performing the test described above. The electromagnetic fields (EMF) are generated by the distribution of charges and currents on paths and elements of the board under test (BUT). Accurate and repeatable measurements of these fields produce a specific pattern for the BUT. Such a pattern is then compared to a known pattern for the same type of board to determine whether the BUT is faulty or non-faulty.

Thus firstly a known standard of an unpopulated circuit board having a required structure and a required function is selected and a signal is applied to the sample arrangement, the signal being independent of the predetermined function of the circuit board. The electromagnetic near-field distribution generated by the sample is then detected using an array of non-contact sensors and the array is used to create a sample pattern representative of the electromagnetic near-field distribution sample arrangement. Subsequently the near-field distribution of a test arrangement is similarly detected and a pattern created therefrom. A comparison is then made between the sample pattern and the test pattern to determine whether the test arrangement is in conformance with the known standard.

The term unpopulated circuit board is intended herein to comprise a circuit board prior to the application thereof of the electronic components.

The above described method can be used to develop a new contactless test system (CTS). The CTS consists of suitable sensors (possibly printed near field planar antennas, monopole antennas, fiberoptic sensors or like items capable of measuring a wide range of signals up to 1 GHz in frequency range), a sensor control unit, a signal source, sensitive measuring and signal processing devices, a central computer workstation, and a test platform onto which the BUT is mounted. The sensor control unit controls the movement of sensors (sensor array) and switches the measured signals to the measuring device. The signal source provides signals, independent of the functionality of any specific board, to energize the BUT. The measurement and signal processing device can be a spectrum analyzer or a network analyzer of wide range frequency bandwidth. The central workstation controls the whole system by commanding sensor movement and sensor switching, receiving the measured results from the spectrum analyzer, and running the off-line fault recognition procedure.

A complete scan of the BUT constitutes one plane of signals. The plane of signals is made up of signals obtained from individual sensors. The signal from each sensor is particularly sensitive to the local electromagnetic field. Therefore, signals from a whole plane of sensors can be processed to image the board's electromagnetic signature. The objective of the signal processing is to extract relevant features from the signals which represent the characteristics of the BUT. These features are used to create images representing the BUT signature. The fault recognition system compares the image of the BUT with a known or desired image of an identical, non-faulty PCB. Such comparisons result in a measure of the difference between the non-faulty and faulty boards. If the difference is larger than a predetermined threshold, the BUT is diagnosed to be faulty. If the difference is smaller than the threshold, the BUT is diagnosed to be non-faulty. Statistical analysis can further result in more detailed information of faults found, such as locations, types, etc.

BRIEF DESCRIPTION OF THE DRAWINGS

The following figures accompany this application to provide a better understanding of the concept of this invention. They reflect implementation aspects of this invention. Each of the figures is identified by a reference character, and wherein:

FIG. 1 is the hardware architecture of the CTS, illustrating hardware components of the implemented system and their interrelationships.

FIG. 2 is the software architecture of the CTS, illustrating software components of the implemented system and their interrelationships.

FIG. 3 illustrates a one-dimensional sensing array, reflecting the concept of a plane sensing mechanism.

FIG. 4 illustrates one-dimensional images of a faulty and non-faulty board.

FIG. 6 illustrates a one-dimensional sensing array similar to that of FIG. 3 in which the energizing signal is applied by contact with the board.

IMPLEMENTING THE INVENTION

Figure 5:
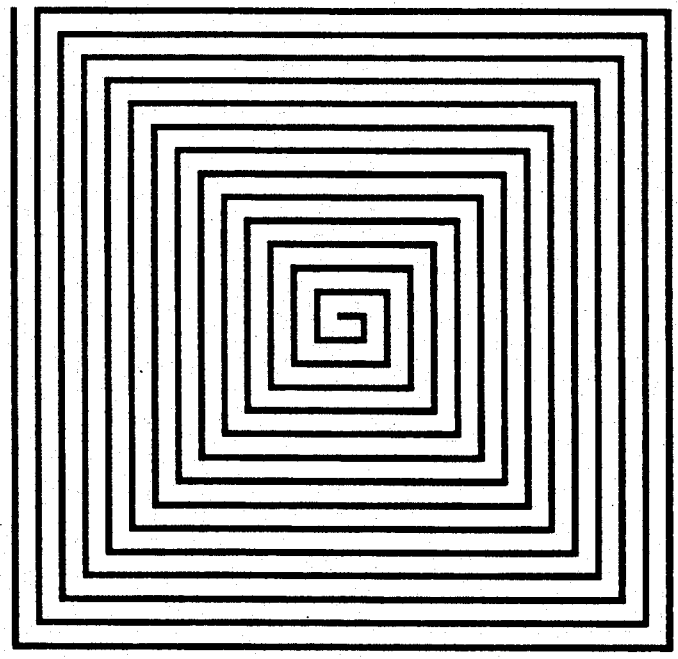
FIG. 5 is a top view of the topology of a printed spiral antenna.

As illustrated in FIG. 1, the implemented contactless test system (CTS), for testing PCBs, consists of suitable sensors (a planar sensing array) 10, a sensor control unit 11, a signal generator 12, a spectrum analyzer or network analyzer 13, a central computer workstation 14, and a test platform 15 onto which the BUT is mounted.

The applied sensor is developed based on interrelations between current, charge, and electric and magnetic field intensities described by the Coloumb-Maxwell, Ampere-Maxwell and continuity equations. They are of the printed planar loop antenna type capable of measuring a wide range of signals up to 1 GHz in frequency range.

For unpopulated BUTs, the signal generator 12 provides common signals, independent of the functionality of any specific board, to energize the BUT at a desired frequency through the power and ground lines of the BUT (FIG. 4). The power and ground lines of the BUT are usually distributed throughout the board, therefore, through coupling, the whole plane of the BUT is energized. The validity of this energizing method can be verified by comparing a measured result from any location on the plane with the noise level of the test environment. If the ratio between the measured result and the noise level is larger than a predetermined signal to noise ratio, then the validity of having energized the whole board is verified. Other common energizing methods are also conceivable. For instance, the BUT can be energized by near field active antenna probes (a type similar to the sensors), connected to the signal generator 12A (FIG. 3), and moving them in conjunction with the sensing probes. This way, the board is guaranteed to be energized because the energizing signal moves with the sensors. This energizing method is more universal and contactless.

For populated BUTs, the energizing method should be modified so that signals applied to the BUT will depend on the functionality of the board.

The sensor control unit controls the movement of a sensor array within the test plane and switches individual sensors, within the array, to the measuring device. The switching circuit within the sensor control unit is able to operate at the desired frequency bandwidth.

The measurement and signal processing device can be a spectrum analyzer or a network analyzer with a wide range frequency bandwidth. The measuring device transforms a time-domain signal from the sensor to its frequency-domain expression. The frequency-domain expression is then integrated to produce a characteristic for the specific sensor.

The central workstation controls the whole system: commanding sensor movement and switching, receiving measured results from the spectrum analyzer or network analyzer, and running the off-line signal analysis and fault recognition procedures.

The test platform contains the BUT within a grounded metallic enclosure 16 (FIG. 3). The purpose of this enclosure is to provide electromagnetic shielding for the interior of the test platform.

FIG. 2 illustrates the software procedures required for the CTS. The sensor control procedure 20 controls the movement and switching of the sensing array. The spectral analysis procedure 21 receives the measured results from the spectrum analyzer or the network analyzer and calculates, over specific frequency bandwidths, the integration of the power spectral density (spectral analyzer mode) or the phase shift (network analyzer mode) of the acquired signals from the sensors. The calculated result constitutes pixel values for an image representing each sensor element at particular locations of the test plane. Such an image represents the characteristic of the BUT. The characteristics can then be displayed on the computer screen with the imaging procedure or passed on to the fault recognition procedure to determine whether the BUT is faulty or non-faulty. The fault recognition procedure is based on a comparison between the image of the BUT and a known image of a non-faulty board of the same type. Such a comparison results in a measure of difference between the two boards. If the difference is larger than a predetermined threshold, the BUT is diagnosed to be faulty. If the difference is smaller than the threshold, the BUT is diagnosed to be non-faulty. Further, regional comparisons can result in information on the actual location of the faults.

FIG. 3 illustrates the side sectional view of the test board with a conducting path layout on the board and an array of sensors above the test board within a grounded metallic enclosure 16. A sensor array may be implemented with a stationary sensor array or a small array of sensors moving across the test plane of the test board.

FIG. 6 illustrates a side sectional view of the test board with a conducting path layout on the board and an array of sensors above the test board. In this arrangement, the energizing signal is applied through a first conductor 12A of the board for connection to the positive supply and a second conductor 12B for connection to a ground return.

FIG. 4 illustrates the one dimensional view of the resultant images obtained according to the above described procedures. The test board is energized by a sinusoidal signal (5 volt peak to peak, at a frequency above 10 MHz). Graph curve (1) is the result of a test board without the introduced fault (a short). Graph curve (2) is the result of a test board with the introduced fault (a short). Because of the introduced short (curve (2)), the adjacent paths are more closely coupled than without the short (curve (1)), therefore they emit a higher signal intensity. The two image results can then be compared to diagnose the fault.

Theoretical background for the solution of loop antennas and their derivatives results from integrating the Maxwell-Faraday equation over a loop area Sa and applying Stokes Theorem thus obtaining $$\oint \vec{E} \cdot \vec{dl} = -j\omega\mu_0 \int\int_{S_a} \vec{H} \cdot \vec{ds} \qquad (1)$$

Consider a printed rectangular spiral antenna-sensor whose top view is depicted in FIG. 5. The sensor is exposed to the reactive (or equivalently fringing) electric and magnetic near-fields surrounding the PCB. The portion of the near-field coinciding with the fringing field is commonly assumed to exist in the space confined at the distance $1/\kappa = \lambda/2\pi$ from an equivalent radiator. The sensor is placed inside a structure which consists of metallic planes of large dimensions. The distance between the planes is small as compared with the wavelength of the upper frequency limit of the applicator. The purpose of this structure is to provide the eddy current shielding of the interior of the applicator. The Green's function of structure is completely determined by this geometry of the contactless tester.

The fringing near-field performance of a single antenna sensor is of interest in response to the standard fields produced by the chosen radiators.

A printed loop antenna may be modeled as an uniformly impedance-loaded loop. The boundary conditions satisfied on the metallic surface S of the sensor are:

$$\vec{n} \times (\vec{E}^+ - \vec{E}^-) = 0 \qquad (2)$$

and $$\vec{n} \times (\vec{H}^+ - \vec{H}^-) = Y_s \vec{E}_t \qquad (3)$$

on the dielectric surface $S_d$. $Y_s$ is the surface admittance of the dielectric layer given by $$Y_s = j\omega(\epsilon - \epsilon_0)d \qquad (4)$$

Where $\epsilon_0$ is the substrate permittivity while $\mu_0$ Equation (1) allows to find a general integral equation for the zero phase-sequence current by the use of the generalized Ohm's law $$j\omega\mu_0 \int_{S_a} \nabla \times \int_{S1} G(\vec{x},\vec{x}^1)\vec{K}(\vec{x}^1) \cdot dS^1 \vec{S}_a = \oint_L Z(\vec{1})I_o(\vec{1}) \cdot d\vec{1} - j\omega\mu_0 \oint_L \oint_L G(\vec{x},\vec{x}_1^1)\vec{I} \cdot_o(\vec{1}^1)d\vec{1}^1 d\vec{1} \qquad (5)$$

The second term on the right hand side represents interaction due to reradiated field. The contour integral in (5) is defined for a single loop. Therefore in order to apply (5) to the printed spiral antenna, segmentation of a spiral into elementary loops is imposed. Then for each loop-segment equation (5) is valid. The continuity of current $\vec{I}_o$ is applied at the separation of each constitutive loop.

Equation (5) is not tractable yet for numerical solution due to the fact both $\vec{I}_o(\vec{1})$ and $\vec{K}(e,rar/\vec{x'})$ are unknown. The Lorentz reciprocity theorem applied to the fields inside the antenna gives second condition which leads to the integral equation:

$$\int_{S_o} \vec{E} \cdot y_s \vec{E}_t dS + \int_{Sm} \vec{E} \cdot \vec{I}_o(\vec{1}) dS = \int_{V_o} \vec{I}_o(\vec{1}) \cdot \vec{E} dv \qquad (6)$$

where $\vec{E}$ is a function of current $\vec{K}(\vec{x}^1)$ on the printed board. Equations (5) and (6) are coupled integral equations for the unknown currents. In order to solve the problem, it is natural to use the rectangular coordinate system because of the geometry in FIG. 5.

Having described the antenna characteristics, the signal received from the antenna must be processed to image the BUT's electromagnetic signature.

Denote a signal from each sensor as $s_{ij}(t)$ for $i=1, \ldots N$ and $j=1, \ldots, M$, where t is the time variable, N and M are the size of the two dimensional sensor matrix. The pattern of $s_{ij}(t)$ is changed by changes in the signature of the PCB under test.

A signal from each sensor can also be represented in the frequency spectral domain. Denoting Fourier transform $$F_{ij}(\omega) = R_{ij}(\omega) + jX_{ij}(\omega) = A_{ij}(\omega)e^{\phi ij(\omega)} = \int_{-\infty}^{\infty} S_{ij}(t)e^{-j\omega t}dt \qquad (1)$$

where $R_{ij}(\omega)$ and $X_{ij}(\omega)$ represent real and imaginary functions of the Fourier transform of signal $s_{ij}(t)$ which has a frequency spectrum given by $$A_{ij}(\omega) = \sqrt{R_{ij}^2(\omega) + X_{ij}^2(\omega)}$$

and $$\phi_{ij}(\omega) = \arctan \frac{X_{ij}(\omega)}{R_{ij}(\omega)}$$

In the spectral domain, imaging of the PCB under test (processing in the spatial domain) is obtained by integrating the spectra in some specific bandwidths. The result of integration for a single sensor is the pixel value (associated with a picture element). The pixel value is computed for bandwidths where $F_{ij}(\omega)$ possesses high signal-to-noise ratio.

Denoting by K the number of significant bandwidths, a signature image of a printed circuit board is defined for the k-th bandwidth in the following form $$I_k(ij)^{def} = \sum_{i=1}^{i=N} \sum_{j=1}^{j=M} \int_{\omega_{kL}}^{\omega_{kU}} A_{ij}^2(\omega)d\omega$$

where $I_k(ij)$ represents the power spectrum image in k-th frequently band $\omega_{kL}$ to $\omega_{kU}$.

The phase angle $\phi(\omega)$ may also be used as a measure of pixel value in an image.

I claim:

1. A method for testing an unpopulated circuit board including a test arrangement of electrically conductive paths, parts, and surfaces whose electrical and physical continuity and conformance to a known standard of a sample arrangement of unpopulated circuit board is to be verified, the sample arrangement having a predetermined required structure for carrying out a predetermined required function, the method comprising providing said known sample arrangement having said required structure and said required function, applying to the sample arrangement an electrical signal, the signal being independent of the predetermined function, providing an array of non-contact sensors for detecting the electromagnetic near field distribution generated by the sample arrangement in response to the signal, using the array to create a sample pattern representative of the electromagnetic near field distribution of the sample arrangement, applying to said test arrangement said electrical signal, using said array to create a test pattern representative of the electromagnetic near field distribution of the test arrangement, making a comparison of the test pattern with said sample pattern of said known sample arrangement and determining from said comparison whether the test arrangement is in conformance to the known standard, the non-contact sensors of the array each comprising a planar printed spiral loop antenna.

* * * * *